United States Patent
Kerr et al.

(10) Patent No.: US 7,203,893 B2
(45) Date of Patent: Apr. 10, 2007

(54) SOFT INPUT DECODING FOR LINEAR CODES

(75) Inventors: Ron Kerr, Kanata (CA); John Lodge, Kanata (CA); Paul Guinand, Fitzroy Harbour (CA)

(73) Assignee: Her Majesty the Queen in Right of Canada as represented by the Minister of Indusrty, though the Communications Research Centre Canada, Ottawa, Ontario (CA)

( * ) Notice: Subject to any disclaimer, the term of this patent is extended or adjusted under 35 U.S.C. 154(b) by 471 days.

(21) Appl. No.: 10/834,115

(22) Filed: Apr. 29, 2004

(65) Prior Publication Data

US 2004/0225940 A1 Nov. 11, 2004

Related U.S. Application Data

(60) Provisional application No. 60/467,564, filed on May 5, 2003.

(51) Int. Cl.
*H03M 13/45* (2006.01)
(52) U.S. Cl. .................................... 714/780
(58) Field of Classification Search ............... 714/780, 714/794, 789; *H03M 13/45, 13/43*
See application file for complete search history.

(56) References Cited

U.S. PATENT DOCUMENTS

| | | |
|---|---|---|
| 5,563,897 A | 10/1996 | Pyndiah et al. |
| 5,930,272 A | 7/1999 | Thesling |
| 6,145,114 A | 11/2000 | Crozier et al. |
| 6,460,162 B1 | 10/2002 | Buda et al. |
| 6,718,508 B2 * | 4/2004 | Lodge et al. ............... 714/780 |

FOREIGN PATENT DOCUMENTS

| | | | |
|---|---|---|---|
| EP | 1168633 A2 | * | 1/2002 |
| FR | 2 675 970 A1 | * | 10/1992 |
| JP | 2003283341 A | * | 10/2003 |

OTHER PUBLICATIONS

A. Viterbi, "Error Bounds for Convolutional Codes and an Asymptotically optimum Decoding Algorithm", IEEE Trans. Inform. Theory, vol. IT-13, pp. 260-269, Apr. 1967.
G. Forney, "The Viterbi Algorithm", Proc. IEEE, vol. 61, No. 3, pp. 268-278, Mar. 1973.
L. Bahl, J. Cocke, F. jelinek, and J. Raviv, "Optimal Decoding of Linear Codes for Minimizing Symbol Error Rate", IEEE Trans. On Inform. Theory, vol. IT-20, pp. 284-287, Mar. 1974.
P. Robertson, E. Villebrun, and Po. Hoeher, "A Comparison of Optimal and Sub-Optimal MAP Decoding Algorithms Operating in the Log Domain", Proceedings of ICC '95, Seattle, pp. 1009-1013, Jun. 1995.
P. Robertson, P. Hoeher, and E. Villebrun, "Optimal and Sub-Optimal Maximum a Posteriori Algorithms Suitable for Turbo Decoding", European Transactions on Telecomm., vol. 8, No. 2, pp. 119-125, Mar.-Apr. 1997.

(Continued)

*Primary Examiner*—R. Stephen Dildine
(74) *Attorney, Agent, or Firm*—Teitelbaum & MacLean; Neil Teitelbaum; Doug MacLean

(57) ABSTRACT

A method of decoding soft input information related to a transmitted word of a linear block code (n, k) and providing hard or soft output information is disclosed. The method comprises the steps of forming a reliability vector from the input information, identifying (n−k) linearly independent least reliable symbols and k most reliable symbols, converting a parity check matrix of the linear block code to a pseudo-systematic form with respect to the least reliable symbols, calculating extrinsic information and composite information for the most reliable symbols using the soft input information and the pseudo-systematic parity check matrix, and calculating extrinsic information for the least reliable systems using composite information for the most reliable symbols.

31 Claims, 8 Drawing Sheets

OTHER PUBLICATIONS

S. Pietrobon, "Implementation and Performance of a Turbo/MAP Decoder", International Journal of Satellite Communications, vol. 15, No. 1, pp. 23-46, Jan./Feb. 1998.

J. Hagenauer, E. Offer, and L. Papke, "Iterative Decoding of Binary Block and Convolutional Codes", IEEE Trans. On Inform Theory, vol. 42, No. 2, pp. 429-445, Mar. 1996.

J. Erfanian, S. Pasupathy, G. Gulak, "Reduced Complexity Symbol Detectors with Parallel Structures for ISI Channels", IEEE Trans. On Communications, vol. 42, No. 2/3/4, pp. 1661-1671, Feb./Mar./Apr. 1994.

P. Robertson and Thomas Wörz, "Bandwidth-Efficient Turbo Trellis-Coded Modulation Using Punctured Component Codes,"IEEE Journal on Selected Areas of Communication, vol. 16, No. 2, Feb. 1998.

Kerr, "Vector Soft-in-soft-out Decoding of Linear Block Codes", 22nd Biennial Symposium on Comm. Of Queens University, Kingston. 'Online! May 31-Jun. 3, 2004, pp. 1-3 XP002322164 www.crc.ca/en/html/fec/home/publications/papers/LOD04_ZBSC_VectorSISOLineare.pdf.

Lucas et al, "On Iterative Soft-Decision Decoding of Linear Binary Block Codes and Product Codes", IEEE Journal on Selected Areas in Communications, vol. 16, No. 2, Feb. 1998; pp. 276-296, XP000741782; ISSN: 0733-8716.

Fossorier et al, "Soft-Decision Decoding of Linear Block Codes based on Ordered Statistics", IEEE Transactions on Information Theory, vol. 41, No. 5, Sep. 1, 1995, pp. 1379-1396, XP000542626, ISSN: 0018-9448.

Fossier et al, "Soft-Input Soft-Output Decoding of Linear Block Codes based on Ordered Statistics", Proc. Of Globecom 1998, Sydney, Australia, Nov. 1998, pp. 2828-2833.

* cited by examiner

SOFT INPUT DECODING FOR LINEAR CODES

CROSS-REFERENCE TO RELATED APPLICATION

This application claims priority of U.S. Provisional Patent Application No. 60/467,564 filed May 5, 2003, entitled "Vectorized Approximate Max-Log-APP Decoding for Linear Block Codes" which is incorporated herein by reference for all purposes.

FIELD OF THE INVENTION

The present invention generally relates to the field of digital communications and storage, and particularly relates to decoding methods for linear block codes that provide soft or hard output information in response to soft input information.

BACKGROUND OF THE INVENTION

Channel coding is widely used to increase the reliability of digital information that has been stored or sent across a transmission channel to a receiver. In digital communications, a commonly used technique is to encode data symbols into a number of messages in block format prior to transmission, adding redundant symbols to each block to assist in further data recovery.

If each code block has n symbols of which k symbols are the original data and (n–k) symbols are the redundant parity symbols, the code is called a block code and is characterized by a duplet (n, k). A valid sequence of n symbols for a block code (n,k) is called a code word, and n and k are hereafter referred to as respectively a length and dimension of the block code. Since there can be many more possible combinations of n symbols in a block of length n than possible datasets of length k, not all combinations of n symbols can be a valid code word, which assists in decoding.

A block code (n,k) is called a linear block code if the sum of each two code words also is a code word. For binary codes, binary addition is assumed to be an exclusive 'OR' (XOR) operation. A parity check matrix, P, of a linear block code (n,k) is any (n–k)×n matrix of rank (n–k) for which $$vP^T = 0 \tag{1a}$$

for any code word of the linear block code (n, k).

The matrix equation (1a) is equivalent to (n–k) row equations corresponding to (n–k) rows of matrix P; these equations hereafter are referred to as parity equations. A symbol location is referred to hereafter as being present in a row of matrix P, if it is present in the corresponding parity equation. A systematic parity check matrix can be represented in a form $$P = [IP'],$$

where I denotes the (n–k)×(n–k) identity matrix.

At a receiver, a block decoder is used to estimate the original message based on the received data samples. An input information vector y of length n received by a decoder is said to be related to a code word v of a linear block code (n,k) if it represents the code word v received after a transmission through a noisy channel. The information vector y is also referred to hereafter as a soft information vector, and its elements are referred to as soft values related to code word symbols, or received samples.

A hard decision is said to be taken on an element of a soft information vector if the element is assigned a value of a nearest symbol. A hard decision vector d related to a soft information vector y is a vector comprised of code symbols in accordance with a certain rule so to approximate the code word v to which vector y is related.

Known decoding approaches can be divided in two categories in accordance with how they utilize an incoming analogue information stream: these are a hard-decision decoding and a soft decision decoding. Hard-decision decoders start with input information in a digitized form of code symbols, or "hard decisions", and use decoding algorithms to attempt to correct any errors that have occurred. Soft-decision decoding (SDD) on the other hand utilizes additional information present in the received data stream. SDD starts with soft decision data that may include hard information indicating which value each received symbol is assigned (e.g. a "1" or a "0" for binary symbols) and an associated value that indicates a reliability or confidence that the value assigned to a particular received symbol is correct. This is generally referred to as "soft input" information. A decoder then utilizes the soft input information to decode the received information so as to produce a code word most likely to represent the original transmitted data.

A maximum likelihood (ML) decoding is a soft decision decoding which seeks to minimize a probability of word error. For a channel with additive white Gaussian noise (AWGN), a ML code word is a code word that minimizes an Euclidean distance to the soft input vector y, or equivalently which minimizes a metric $$\text{metric}(j) = 1/2 * \sum_{m=1}^{n} d_{m,j} y_m, \tag{1b}$$

where $d_j$ is a j-th code word, $y_m$ is an m-th element of the soft information vector y, and $d_{m,j}$ is an m-th element of the j-th codeword.

Finding a most-likely code word for given soft input information can be a very complicated task; constructing an efficient decoder is thus a matter of great importance.

The value of any coding technique increases if the decoder output includes not only an accurate estimate of the original symbols but also reliability information or a confidence measure that the decoded symbols are correct. This is generally referred to herein as "soft output" information. Soft output information as to the reliability associated with each decoded bit can be useful, for example, with iterative decoding techniques.

There are very well known techniques for hard decision decoding of linear block codes. It is also well known that soft-decision decoding of a code provides a fundamental gain in performance. There are trellis-based techniques for specific codes that allow soft-decision decoding, however, for many codes the trellis representation for the code is computationally intractable due to an exceedingly large number of states required. It is important to have a decoder of a reasonable complexity that can take advantage of soft decision decoding.

A method of iterative decoding a product code that was made up from two systematic block codes was proposed in U.S. Pat. No. 5,563,897 "Method for detecting information bits processed by concatenated block codes" by R. Pyndiah, A. Glavieux, and C. Berrou.

In the method presented Pyndiah et al. determine a number, p, of least reliable positions in the received code word. The process then constructs a number, q, of binary words to be decoded from the p locations and a decision vector. The process then generates a number of code words by algebraic decoding (hard decision) decoding the decision vector of q binary words. The algorithm then generates a metric for each code word based on the Euclidean distance of the code word from the input soft information and then selects the code word with the smallest metric. The method then updates the decision vector based on the selected code word and calculates a correction vector. The correction vector is multiplied by a confidence coefficient and then added to the input vector (received samples plus previous updates). The method is limited to product codes that are formed by systematic linear binary block codes.

Another method was proposed by W. Thesling in U.S. Pat. No. 5,930,272 entitled "Block decoding with soft output information". The method taught in '272 forms a hard decision vector, b, on the received signal samples of length n. The method then performs a hard decision decoding on the hard decisions in b to produce an error pattern, e. The result of the hard decoding is used to form a "centre" code word and the algorithm finds p nearby code words including the "centre" code word. For each of the code words taking the Hamming distance between the code word and the hard decision vector b forms a difference metric. A code word that has a minimum difference metric among the 'nearby' code words forms a hard decoding output. A confidence measure for each bit is formed via the difference of the difference metrics between the code word with the minimum difference metric with a '0' in that position and the code word with the minimum difference metric with a '1' in that position.

F. Buda and J. Fang disclose a method of "Product code iterative decoding" in U.S. Pat. No. 6,460,162. The decoder receives a code word of length n that is determined by an (n,k) linear block code from a transmission channel. The decoder inputs soft samples of the code word received from the channel and finds k most reliable signal samples. By using the k most reliable signal samples of the code word to generate m least reliable bits (where m is less than k) and makes hard decisions based on the most reliable k components of the code word. If the k most reliable signal samples cannot generate the other n–k components then there is a change in the selected k bits and the process is attempted again. Once the m bits are generated hard decisions on the k–r remaining signal samples are made. This method generates a list of code words that are close to the received code word by changing the values of the m bits. The soft output is then calculated for each bit as differences between the metrics of the selected code words.

The decoding methods of the aforementioned patents for soft-in, soft-out decoding are essentially approximate implementations of an a posteriori probability (APP) decoder. An APP decoder finds a probability of each data symbol at each symbol time given the entire received signal. Thus it also inherently provides a most likely symbol value at each symbol time given the entire received signal. This is in contrast to the well-known Viterbi algorithm, which performs maximum likelihood sequence estimation (MLSE) as discussed in A. Viterbi, "Error Bounds for Convolutional Codes and an Asymptotically optimum Decoding Algorithm", IEEE Trans. Inform. Theory, Vol. IT-13, pp. 260–269, April 1967; and G. Forney, "The Viterbi Algorithm", Proc. IEEE, Vol. 61, No. 3, pp. 268–278, March 1973. That is, the Viterbi algorithm finds the entire sequence that was most likely transmitted given the received signal.

Both algorithms are optimum for their respective criteria, but the APP decoding scheme more naturally provides the soft information required for iterative decoding.

Log-APP is a form of APP processing where the quantities manipulated are not probabilities, but rather "log-probability quantities" derived from probabilities. The term "log-probability quantity," herein refers to log-probabilities, log-probabilities with offsets, sums of log-probabilities, differences of log-probabilities, and combinations of these. Note that a "log-probability" is simply a logarithm of a probability; the base of the logarithm is arbitrary.

Manipulating log-probability quantities, rather than working with the probabilities themselves, is generally preferred due to computational issues such as a finite-precision representation of numbers, and since the log-probability quantities represent information as it is defined in the field of Information Theory.

A "log-likelihood ratio" (llr) is a logarithm of a probability ratio, that is, a difference between two log-probabilities; it is a common log-probability quantity used in log-APP processing. For a binary case, the log-likelihood ratio for a received "soft" i-th sample $y_i$ related to a code symbol $v_i$ being a 0 bit is defined as:

$$llr_i = \log(Pr\{y_i = `1`\}/Pr\{y_i = `0`\})$$

where $Pr\{v_i = `0`\}$ is a probability of the bit $v_i$ being a 0 bit. For a channel with additive white Gaussian noise (AWGN), where soft input samples $y_i$ are related to original code symbols $v_i$ as $$y_i = v_i + n_i,$$

where $n_i$ is a Gaussian noise sample with zero average, a log-likelihood ratio for a received bit is proportional to the soft input value for the bit. For example for a Gaussian channel and a BPSK modulation format the following expression holds:

$$llr_i = \left(\frac{4\sqrt{E_s}}{N_0}\right) y_i.$$

for techniques that maximize or minimize correlative "metrics", we can ignore the proportionality constant.

The concept of log-likelihood ratios is not restricted to a binary case and can be applied to m-ary symbols, states, and so forth. When the entities being considered are any of "m" choices, at most m−1 log-likelihood ratios are needed to fully describe the likelihoods associated with any particular entity. In a most common case of m-ary modulation m is a power of 2, i.e. $m = 2^N$ where N is a number of bits in each m-ary symbol, and log-likelihood ratios can be calculated for each bit considering them separately, and only N llr's are therefore required. For example, with an 8-ary constellation each symbol represents 3 bits, and the llrs can be calculated for each the first, second and third bit.

Generally, log-APP processing amounts to adding extra information, called extrinsic information, to the input information.

The term "extrinsic information" is generally used to refer to a difference between output values and input values of a log-APP process including a max-log-APP process. For a binary code, the term extrinsic information refers to a log-likelihood ratio (or an approximation to it) for a given bit based on the log-likelihood ratios of all the other bits (excluding the given bit) and the known structure of the error correcting code.

Max-log-APP is a form of log-APP processing where some or all calculations of expressions of the form $\log_b(b^x + b^y)$ are approximated as $\max(x,y)$. The letter "b" is used to denote the base of the logarithm, which is arbitrary. The letters "x" and "y" represent the quantities being "combined", which are typically log-probability quantities having the same base "b". Introducing this approximation into the log-APP calculations generally results in a degradation of the results of an overall process of which the max-log-APP process is a part, but using the approximation can provide a significant reduction in computational complexity and thereby improve speed of processing. Max-log-APP processing is not, in mathematical terms, equivalent to standard log-APP processing, but is an approximation thereto.

A detailed description of APP decoding algorithms is provided in, for example, L. Bahl, J. Cocke, F. Jelinek, and J. Raviv, "Optimal Decoding of Linear Codes for Minimizing Symbol Error Rate", IEEE Trans. on Inform. Theory, Vol. IT-20, pp. 284–287, March 1974; P. Robertson, E. Villebrun, and P. Hoeher, "A Comparison of Optimal and Sub-Optimal MAP Decoding Algorithms Operating in the Log Domain", Proceedings of ICC'95, Seattle, pp. 1009–1013, June 1995; P. Robertson, P. Hoeher, and E. Villebrun, "Optimal and Sub-Optimal Maximum a Posteriori Algorithms Suitable for Turbo Decoding", European Transactions on Tele. Vol. 8, No. 2, pp. 119–125, March–April 1997; S. Pietrobon, "Implementation and Performance of a Turbo/MAP Decoder", submitted to the International Journal of Satellite Communications, Vol. 15, No. 1, pp. 23–46, January/February 1998; J. Hagenauer, E. Offer, and L. Papke, "Iterative Decoding of Binary Block and Convolutional Codes", IEEE Trans. on Inform Theory, Vol. 42, No. 2, pp. 429–445, March 1996; J. Erfanian, S. Pasupathy, G. Gulak, "Reduced Complexity Symbol Detectors with Parallel Structures for ISI Channels", IEEE Trans. on Communications, Vol. 42, No. 2/3/4, pp. 1661–1671, February/March/April 1994, U.S. Pat. No. 6,145,114 in the names of Crozier, et al. The prior art max-log-APP decoding algorithm is now briefly described in the context of binary codes and an AWGN channel model; the algorithm can be however used in other systems with more complicated signaling constellations and channels.

The log-APP decoding determines for each bit position a logarithm of a ratio of likelihood that the bit is a "1" to a likelihood that the bit is a "0" given a known value of the received sample and a known code structure.

Denote a sequence of coded bits representing an entire transmitted code word as $\{v_l\}$, and a corresponding sequence of noisy received samples as $\{y_l\}$, where a symbol location index l varies from 1 to n. Let further $d_{i,j}$ represent a bit at time index 1 for a $j^{th}$ code word. In vector/matrix notation, denote a $j^{th}$ code word as $d_j$ and the vector of received samples as y.

A bipolar mapping of the binary one-bit symbols of the code is assumed, so that logical "0" and "1" are presented at the input of the decoding process as 1 and −1, respectively.

Denote further a maximum likelihood (ML) code word under a constraint that $v_l=1$ as a code word j, and an ML code word under a constraint that $v_l=-1$ as a code word j'. Such code words are hereafter referred to as complimentary ML code words for a bit location l.

If the ML code words j and j' can be efficiently determined, the log-likelihood ratio for the l-th bit given the whole received sequence is estimated in max-log-APP approximation as a difference of the metrics (1b):

$$1/2 \sum_{\substack{m=1 \\ \text{code word } j}}^{n} d_{m,j} y_m - 1/2 \sum_{\substack{m=1 \\ \text{code word } j'}}^{n} d_{m,j'} y_m = y_k + \sum_{\substack{m \neq l \\ d_{m,j} \neq d_{m,j'}}} d_{m,j} y_m \quad (2)$$

$$= llr_l^i + llr_l^e$$

The right-hand side of the equation (2) is composite information for an l-th bit; it only involves the bit positions for which the two code words differ. This composite information vector constitutes an output of an APP algorithm.

The first term $llr_k^i$ of the composite information is an intrinsic information, or a log-likelihood ratio for the symbol (i.e., the noisy channel sample), which is an APP algorithm input.

The second term $llr_k^e$ provides an approximation to the extrinsic information that would be obtained using true APP processing. The extrinsic information for a symbol refers to the log-likelihood ratio, or an approximation to it, for the symbol based on the log-likelihood ratios of all other symbols in the code word excluding the given symbol, and the known structure of the error correcting code.

Equation (2) provides a direct way to generate a max-log-APP decoding output from a soft input information and known ML code words. For codes that can be characterized by a trellis with a fairly small number of states, a number of algorithms, e.g., the Viterbi algorithm, are available to find the constrained ML code words. However, for more complicated codes, such as reasonably powerful block codes, it is usually prohibitively difficult. Consequently, while the max-log-APP approach is simpler than one based upon true APP, it can still be impracticably complex because of the requirement to find the ML code words.

The object of this invention is to provide an efficient soft input decoding method based on an approximate max-log-a-posteriori probability decoding approach for linear block codes that is capable of outputting soft or hard decisions on the symbols.

The method hereafter disclosed does not generate a list of 'nearby' code words and does not calculate the metrics using the list, as it is done in U.S. Pat. No. 5,930,272. The method does not generate metrics for 'candidate' code words, and does not require a search over the list to calculate the extrinsic value for the bits in the code word, as in U.S. Pat. No. 5,563,897 and U.S. Pat. No. 6,460,162. The method of present invention uses the input soft values and extrinsic information from the parity equations in a pseudo-systematic form to generate a composite information vector for the 'most reliable' bits. If there is a sign difference between the composite information and the current 'best' hard decision vector for the 'most reliable' bits then the hard decision vector is updated and the parity equations are again 'pseudo-systematically' processed to form a new set of parity equations. The new parity equations are used to re-code the symbol values in the 'systematic', "least reliable" portion of the parity matrix to form a new code word. In this way, the algorithm adjusts the decision vector until it converges to a code word that does not have a sign difference between the composite information and the decision vector (a property of the maximum likelihood code word). Thus, neither a finite list of candidate code words is generated nor metrics computed for each code word. The extrinsic information is calculated using the input information and the final set of parity equations. Also, the parity equations generated by this processing will always be full rank, and therefore the n–k least-reliable symbols can always be computed from the k most reliable symbols.

This method is easily vectorized. The operations are easily implemented with vector and matrices, which for certain implementations is beneficial. The computations can be performed on processors in parallel.

SUMMARY OF THE INVENTION

In accordance with the invention, a method of decoding soft input information related to a transmitted word of a linear block code (n, k) of length n and dimension k is provided, comprising the steps of a) forming a reliability vector from the input information, b) identifying (n–k) linearly independent least reliable symbols and k most reliable symbols, and converting a parity check matrix P of the linear block code to a pseudo-systematic parity check matrix Ps with respect to the least reliable symbols so that each of (n–k) parity equations associated with the (n–k) rows of the pseudo-systematic parity check matrix Ps includes only one least reliable symbol, c) determining extrinsic information for each most reliable symbol from the input information and the pseudo-systematic parity check matrix Ps by first computing partial extrinsic information from each row of matrix Ps for symbol positions present in a particular row and then summing for each symbol position the partial extrinsic information values computed from different rows of Ps, d) computing composite information vector for the most reliable symbols by adding the extrinsic information and the input soft information, e) generating output information by calculating extrinsic information for the least reliable symbols using parity equations associated with the rows of the pseudo-systematic parity check matrix Ps and the extrinsic information for the most reliable symbols, and/or assigning hard information values for the least reliable symbols using parity equations associated with the rows of the pseudo-systematic parity check matrix Ps and hard information values for the most reliable symbols.

In some embodiments, the method is an iterative method wherein the composite information for the most reliable symbols computed in one iteration of the method is used in a next iteration for calculating a new reliability vector for identifying a new set of (n–k) least reliable symbol positions from the new reliability vector and a new pseudo-systematic matrix, and wherein the iterations are repeated until all elements of the reliability vector corresponding to the most reliable symbols exceed a pre-determined threshold, or a maximum number of iterations is reached.

DETAILED DESCRIPTION OF THE INVENTION

Several definitions and notations used hereafter will be now described.

All matrix operations are defined in this specification as being row column interchangeable, so that the meaning row can be a column, and the meaning column can be a row, when this interchanging is applied consistently throughout the specification.

A parity check matrix is referred to as being in pseudo-systematic form relative to a set of (n–k) symbols positions if by a permutation of its n columns, the matrix can be put in a form $$P=[IP'],$$

where I denotes the (n–k)×(n–k) identity matrix.

A set of symbol positions (i.e., indices in the code word vector) are said to be linearly independent if the corresponding columns of a parity check matrix are linearly independent. If a matrix is in a pseudo-systematic form with respect to a set of (n–k) symbol positions, these symbol positions are linearly independent.

Input information vector y of length n is assumed to be related to a code word v of a linear block code (n,k) if it represents the code word v received after a transmission through a noisy channel. The information vector y is also referred to hereafter as a soft information vector, and its elements are referred to as soft values related to code word symbols, or received samples.

An n-tuple vector z related to a code word v is referred to as a soft output vector if a value of each of it elements relates to a probability of the element to represent a particular code symbol.

A decision is said to be taken on an element of a soft information vector if the element is assigned a value of a most-likely code symbol.

A hard decision vector d related to a soft information vector y is a vector comprised of code symbols in accordance with a certain rule so to approximate the code word v to which vector y is related.

Figure 1:
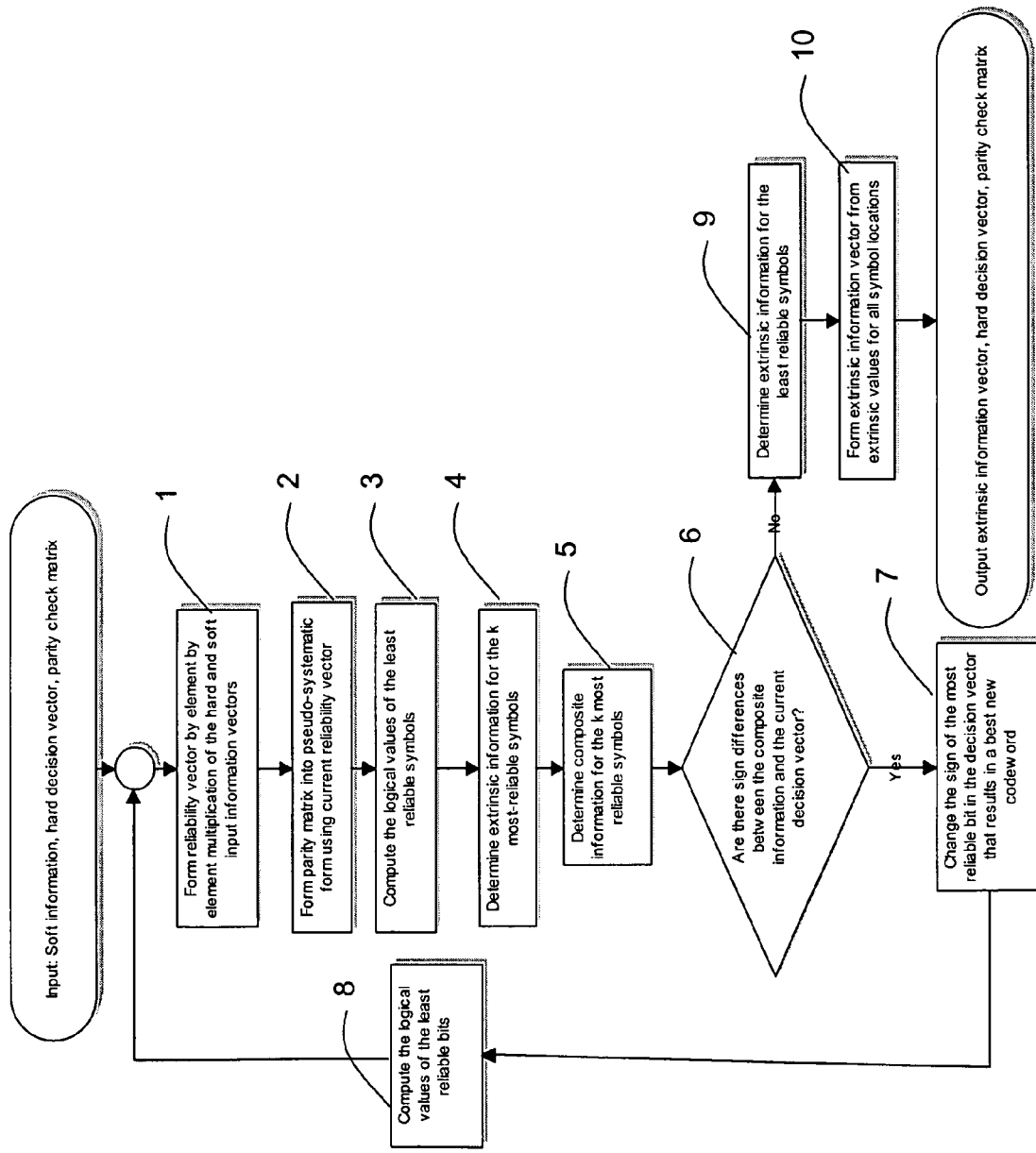
FIG. 1 is a flowchart of a decoding process set to update the decision metric and output soft decisions for code word symbols.

A preferred embodiment of the approximate max-log-APP decoding method for linear block codes (n, k) in accordance with the present invention is shown in FIG. 1 and is hereafter described.

In the preferred embodiment the linear block code is a binary code where code symbols are bits. A bipolar mapping of the bits is further assumed, so that logical "0" and "1" corresponds to bit values of 1 and –1, respectively.

With reference to FIG. 1, the decoding process is provided with a vector of hard decisions d and a vector of soft values y, both of length n.

The hard decision vector d may be a vector of hard decisions on the input soft values. In another embodiment, the vector d may be an estimate of the maximum-likelihood code word made by a maximum-likelihood decoder. The hard decision vector d can also be generated from any function of the original received signal or samples representing or forming the symbols and any information about the symbols available through any means; including by not limited to another decoder, or a previous iteration of the same decoder. Initially, the hard decision vector d does not have to be a codeword.

The soft values $y_k$ can be represented by a real or integer number. The soft values can be any function based on the received signal with noise and any available information about the symbols prior to the decoding. As an example, the soft values could be made up from the intrinsic values for the symbols and a scaled version of the extrinsic values for the symbols available from a previous decoding process.

A parity check matrix P for the code can be either provided to the decoding process as an input, or alternatively can be provided as a part of the decoder.

In a first step 1, the reliability vector is formed by the element-by-element multiplication of the decision vector, d, and the input soft values, y:

$$r_i = d_i y_i \quad (3)$$

where an index i of vectors elements ranges from 1 to n. This forms a "signed" reliability vector wherein values less than zero correspond to elements where there is a sign disagreement between the elements in d and y.

In a second step 2, (n–k) linearly independent least reliable symbols and k most reliable symbols are identified, and the parity check matrix P of the linear block code is converted to a pseudo-systematic parity check matrix Ps with respect to the least reliable symbols, so that each of (n–k) parity equations associated with the (n–k) rows of the pseudo-systematic parity check matrix PS includes only one least reliable symbol.

Figure 2:
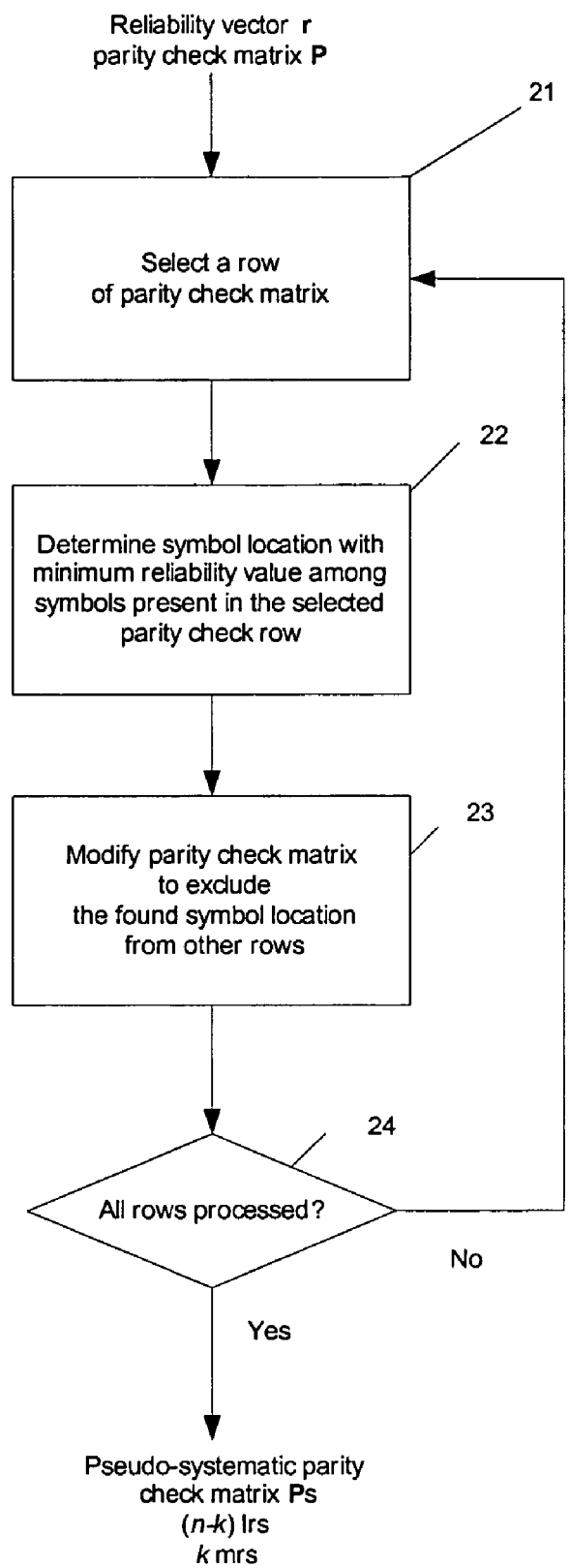
FIG. 2 is a flowchart of computing a pseudo-systematic parity check matrix.

The second step 2 comprises steps shown in FIG. 2.

In reference to FIG. 2, a row from the parity check matrix that has not been processed is selected in step 21. In step 22 the bit position with the minimum value in the reliability vector is found and denoted as a least reliable symbol position. In step 23 the parity check matrix is modified such that said symbol position is no longer involved in any other parity equation in the matrix; this can be done for example by a row reduction technique known to those skilled in the art. This process is repeated until all of the (n–k) parity check equations have been processed, and (n–k) least reliable symbol positions have been identified. The new matrix Ps is in a pseudo-systematic form with respect to the (n–k) least-reliable symbol positions. The symbol positions are thus separated into the "least reliable symbols" (lrs) that are in the "systematic" portion of the matrix, and "most reliable symbols" (mrs) in the "non-systematic" portion of the matrix. A set of parity equations associated with (n–k) rows of the pseudo-systematic parity check matrix Ps is hereafter referred to as a pseudo-systematic set of parity equations.

In a next step 3, elements of the hard decision vector d for the lrs positions are updated by computing their new logical values from the pseudo-systematic parity equations and elements of the hard decision vector d for the mrs positions. The new hard decision vector d formed thereby is now a code word. This code word is hereafter referred to as a re-coding solution, and the process of its calculation as re-coding.

An algorithm disclosed in U.S. Pat. No. 6,460,162, issued to Buda et al. sorts the components of a received code word into increasing order of reliability. In an (n,k) linear code, the k bits with the highest reliability are used to generate the remaining n–k bits if it is possible. It is sometimes not possible as the set of least reliable bits may contain linearly dependent sets of bits that can not be regenerated by the most reliable bits. The algorithm of Buda et al. must verify whether the k bits can generate the n–k bits; otherwise it must permute the bits and repeat the verification. The method of the present invention separates the bits into n–k linearly independent least reliable symbols and k most reliable symbols, so there is no need to verify whether the n–k lrs can be computed by re-coding, which is guaranteed by the procedure. Thus, the method of present invention does not have the steps of sorting the symbols by reliability, verification that the k symbols can generate the n–k remaining symbols or the permutation steps of the algorithm disclosed in the U.S. Pat. No. 6,460,162.

The method of the present invention also differs in a way it defines reliability; it uses a "signed" reliability vector where the sign is a function of decision agreement between elements in the "best" decision vector d and elements in the soft information y. Buda et al consider only the magnitude of the element of y in the reliability.

In reference to FIG. 1, in a forth step 4, approximate extrinsic information values for the k mrs are directly calculated using the input soft information vector and the matrix Ps. Computation process for generating the approximate extrinsic information will be now explained.

In reference to equation (1), a reasonable approximation to an $l^{th}$ extrinsic information is to take the metric difference between the best decision, and a re-coding solution with all of the mrs remaining the same except for the $l^{th}$ one. Thus, the extrinsic information becomes $$llr_l^{\hat{2}} = d_{l,j} * \sum_{\substack{m \neq l \\ d_{m,j} \neq d_{m,j'}}} d_{m,j} y_m,$$

where each of the m locations corresponds to an lrs and multiplication by $d_{l,y}$ accounts for the possibility that the $l^{th}$ bit in the vector of best decisions may be either a '+1' or a '–1'.

In accordance with the decoding method being disclosed herein, approximate extrinsic information for each mrs is determined by combining partial extrinsic information for the mrs computed from each of the pseudo-systematic parity check equations.

Extrinsic information refers to a log-likelihood ratio for a given bit based on log-likelihood ratios of all the other bits excluding the given bit, and known structure of the error correcting code. Similarly, a herein defined partial extrinsic information is based on a subset of the other bits and a subset of the structure of the error correcting code as represented by a pseudo-systematic parity equation. The extrinsic information for a given bit is then computed as a sum of the partial extrinsic information calculated from all of the parity equations that include said bit.

First partial extrinsic information for each parity equation is found as follows: For each of the (n–k) parity equations defined by the pseudo-systematic parity check matrix Ps, a vector of indices of the bits that are involved in the parity equation, p, is formed. A new reliability vector r' and a new hard decision vector d' are formed for the locations involved in the parity equation by using the vector p.

$$r'_l = r_{p_l} \quad (4)$$

$$d'_l = d_{p_l} \quad (5)$$

where l ranges from 1 to n', where n' is the length of the current parity equation.

Taking into account that the received sample with the smallest magnitude is the one most likely to be in error, a partial extrinsic vector for an m-th parity equation can be computed using a following vector equation $$X_{m,p} = d_{b_m} y_{b_m} \prod_{k=1}^{n'} d'_k \qquad (6)$$

where m is the parity equation index, p is the vector of indices of the bits that are involved in the mth parity equation, n' is the number of indices in the vector p, b is a vector of indices of the least reliable bit positions in the code word, $y_{b_m}$ and $d_{b_m}$ are respectively the input soft information and the hard information for the systematic bit which occurs at location $b_m$ in the original vector of soft values y for the $m^{th}$ parity equation, and X is a (n–k)×n matrix that stores the extrinsic values calculated from the parity equations. Note that in Equation (6)

$$d_{b_m} y_{b_m} \prod_{k=1}^{n'} d'_k$$

determines the sign associated with the partial extrinsic information. This sign is given by the product of signs of all bits except the lrb position; it may be however easier to compute the product of all signs of bits in the equation and then remove the influence of the lrs bit by multiplying the product by that sign.

In the case when the best decisions available are hard decisions made on the input soft values, equation (6) becomes $$s_j = \text{sign}(y_{p_j}) \prod_{n=1}^{n'} \text{sign}(y_{p_n}) \qquad j = \{1, 2, \ldots n'\} \qquad (7)$$

$$X_{m,p_j} = s_j |y_{b_m}| \qquad j = \{1, 2, \ldots n'\} \qquad (8)$$

where b is a vector indices of the least reliable bit positions in the code word, $y_{b_m}$ is the input soft value for the systematic bit which occurs at location $b_m$ in the original vector of soft values y for the $m^{th}$ parity equation, p in an vector indices of the bits involved in the mth parity equation, and n' is the number of bits involved in the parity equation. Note that the second element in Eq. 7 could be pre-computed and not recomputed n' times.

Calculations of partial extrinsic values in accordance with equations (6) or (7) and (8) are repeated for all (n–k) parity equations. The extrinsic values for most reliable bits is formed by summing the columns of the X matrix that are associated with most reliable bits $$x_t = \begin{cases} \sum_{j=1}^{n-k} X_{j,t} & t \notin b, t \in \{1, 2, \ldots, n\} \\ 0, & t \in b \end{cases} \qquad (9)$$

where b is a vector of column indices associated with the least reliable bits.

In reference to FIG. 3, computation of the approximate extrinsic information for the most reliable bits can be summarized as follows. First, in a step 31 a row of a pseudo-systematic parity check matrix Ps is selected. Next, in a step 32 a set of partial extrinsic information $X_{m,p}$ is determined for the most reliable symbol locations p present in the parity equation, by multiplying the reliability value of the least reliable symbol present in the parity equation by the product of the signs of the elements of the hard decision vector for the most reliable bits in the equation, excluding the current bit for which the partial extrinsic information is calculated. When all (n–k) rows of the pseudo-systematic parity matrix are processed, an extrinsic information vector for the most reliable symbols is computed in a step 34 by summing partial extrinsic information values $X_{m,t}$ for each most reliable symbol location from each parity equation which includes it.

In some embodiments, the partial extrinsic information values $X_{m,p}$ can be scaled as a function of the length of the corresponding parity equation n' prior to the step 34 of calculating the extrinsic information vector x; such scaling can improve convergence of the iterative processing which is described hereafter.

In a next step 5 of the algorithm, an approximate composite information vector for the mrs locations is formed. The approximate composite information vector c of length k is computed by summing the input soft information vector y with the extrinsic information vector x.

In a next step 6 signs of the vectors c and d are compared for each mrs location. If the hard decision vector d used in calculations of the approximate composite information vector c were a maximum-likelihood (ML) code word, then each element cs of the composite information vector c would have the same sign as a corresponding i-th element $d_i$ of the decision vector d. Otherwise if there exist an mrs location i' such that the signs of $d_{i'}$ and $c_{i'}$ differ, then changing the sign of $d_{i'}$ will produce a better approximation to an ML code word at the i'-th mrs location.

Therefore if a sign difference between vectors c and d is identified in the step 6 at an mrs location i', the method proceeds to a next step 7 wherein a new set of "best" hard decisions for mrs locations is determined by changing the sign of the hard decision $d_i$'.

If the signs of d and c differ for several mrs locations $i'=\{i'_1, i'_2, \ldots\}$, the new "best" set of decisions for mrs can be found by changing a sign of an element of $d_{i'}$ for a bit location $i'_i$ corresponding to a largest composite information magnitude among elements of $c_{i'}$.

In another embodiment, the aforedescribed procedure of the steps 6 and 7 of updating of the signs of the decision vector d can have an alternative implementation comprising the steps of a. element by element multiplication of vectors c and d,
b. finding a minimum element of a vector calculated in step (a) and its location,
c. if the minimal element found in step (b) has a negative value, changing a sign of an element of the vector d at the symbol location found in step (c)

This alternative implementation can be beneficial for embodiments wherein a sign multiplication is less complex, for example requires less processor computations, than a comparison.

Once the new set of "best" hard decisions is determined, a new set of lrs symbol values are computed in a next step 8 using the pseudo-systematic set of equations, and a new hard decision vector d is formed from the new sets of "best" hard decisions for mrs and lrs locations.

The processing then returns to the step 1, where a new reliability vector is formed by multiplying the soft input vector by the new "best" decision vector and, and hereafter follows steps 2–6 where a new pseudo-systematic parity check matrix, a new vector of extrinsic information and a new composite information vector are formed, and signs of the new hard decisions for mrs locations are compared with the signs of the corresponding new composite information.

If a sign difference is once again determined, the algorithm repeats steps 7-8-1-2-3-4-5-6 iteratively. Note that consecutive iterations of step 2 can use any parity check matrix that defines the code as an input. However, complexity reduction is possible during the iterative process by using the latest parity check matrix that is in the "pseudo-systematic" form with respect to the lrs locations defined during the preceding iteration. In this case new changes to the reliability vector will only affect a few of it elements. As a result the new pseudo-systematic matrix generated in the current iteration will have many of the same symbols in the "systematic" portion of the matrix that was calculated in the previous iteration. For these symbols, the row reduction can be skipped, which saves processing for the algorithm.

The iterations through steps 7-8-1-2-3-4-5-6 continue until in the step 6 it is determined that there is no sign difference between elements of the latest hard decision and composite information vectors at any of the mrs locations, or a maximum number of iterations is reached.

Following steps depend on requirements to output information.

Figure 4:
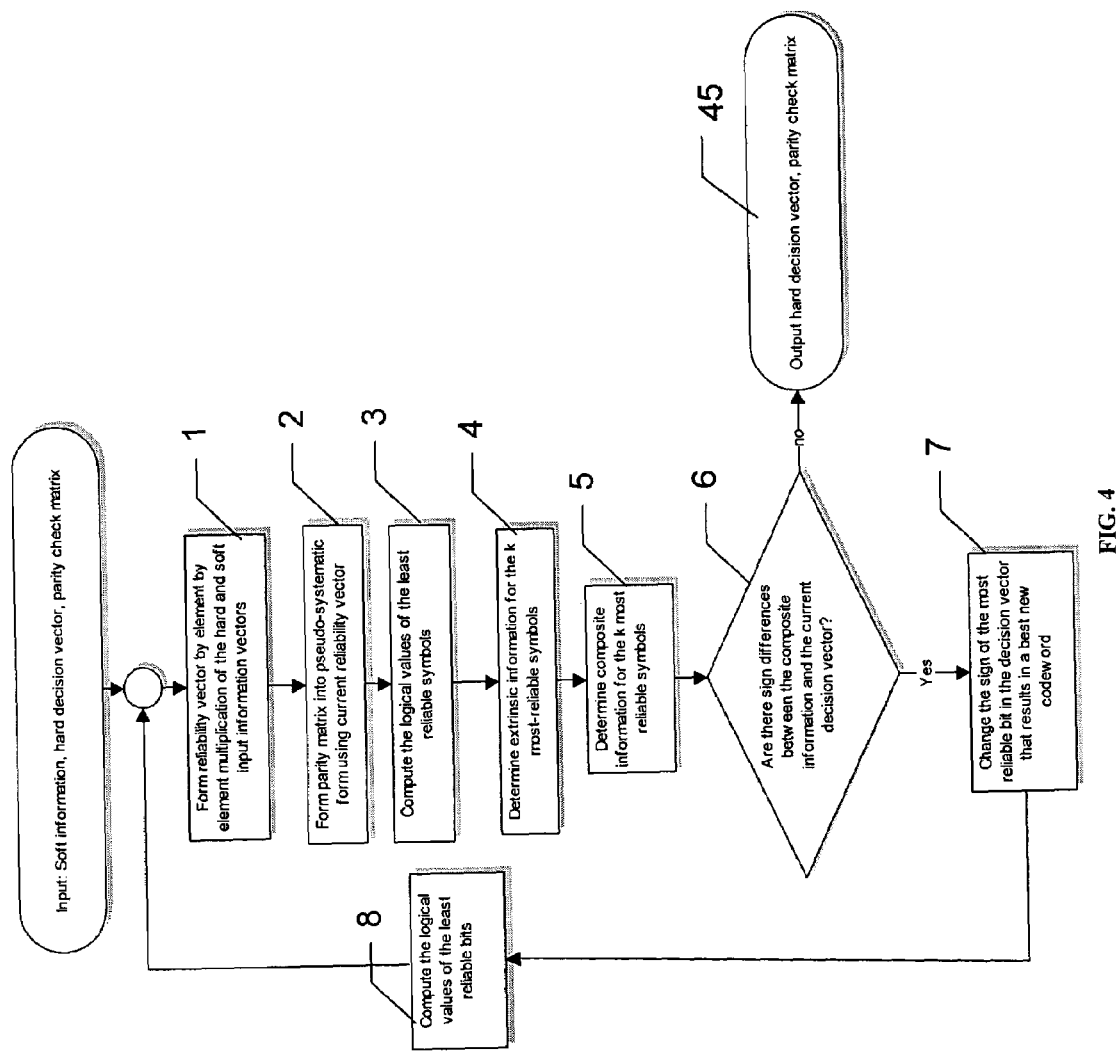
FIG. 4 is a flowchart of a decoding process set to update the decision metric and output hard decisions for code word symbols.

In one embodiment, only a hard decoding output is required. With reference to FIG. 4, after the iterations are completed, a final "best" decision vector d forms a hard output of the decoder in a final decoding step 45.

In the preferred embodiment, the decoder outputs both a soft and hard information.

With reference to FIG. 1, after completing iterations through steps 1–6, in a next step 9, extrinsic information for lrs locations is computed, and then combined with the extrinsic information for mrs in a final step 10 to form a soft output vector.

Note the n–k extrinsic values are calculated just prior to the process terminating, and only if the soft-output is required. This saves processing as the internal iterative processing comprising the steps 1–7 does not require the soft information to be computed for the entire vector.

An algorithm for computing extrinsic information for lrs will now be explained.

Recall that each row in the final pseudo-systematic parity check matrix represents a parity equation that includes only a single lrs, with the remainder of the entries being the mrs. Furthermore, the previously computed composite information for each of the mrs represents a difference between the metrics for the best code word and a recoded code word with the given mrs flipped. Each of the mrs composite information values are candidates for the composite information value for the lrs, with an appropriate sign adjustment. The best choice is the one with the smallest magnitude, because this is the one with the best pair of metrics between the best code word and a recoded code word.

Assume that a parity equation is selected from the pseudo-systematic set, and an lrs present in the selected parity equation has a position index i; assume further that a $k^{th}$ position corresponds to an mrs with the smallest composite information among the mrs present in the selected parity equation. A composite information for the $k^{th}$ mrs can be found from Equations (1) as $$llr_k^c = y_k + d_{k,j} * \sum_{\substack{m \neq k \\ d_{m,j} \neq d_{m,j'}}} d_{m,j} y_m, \qquad (10)$$

and the extrinsic information for the $k^{th}$ mrs can be found from Equation (2) as $$d_{k,j} * llr_k^e = |llr_k^e| = \sum_{\substack{m \\ d_{m,j} \neq d_{m,j'}}} d_{m,j} y_m. \qquad (11)$$

The first equality in (11) holds because the signs of the composite information and the best code word must agree. Comparing Equation (11) to Equation (10) it is clear that a composite information for an lrs having an index i can be computed as $$llr_i^c = d_{i,j} * |llr_k^e|, \qquad (12)$$

and hence the extrinsic information for the lrs can be computed from the composite information for the $k^{th}$ mrs which has the smallest magnitude $$llr_i^e = d_{i,j} * |llr_k^e| - y_i. \qquad (13)$$

Multiplying by $d_{i,j}$ corresponds to the aforementioned sign adjustment. If the composite information is a desired output rather than the extrinsic information, the step of subtracting $y_i$ should be eliminated.

Figure 5:
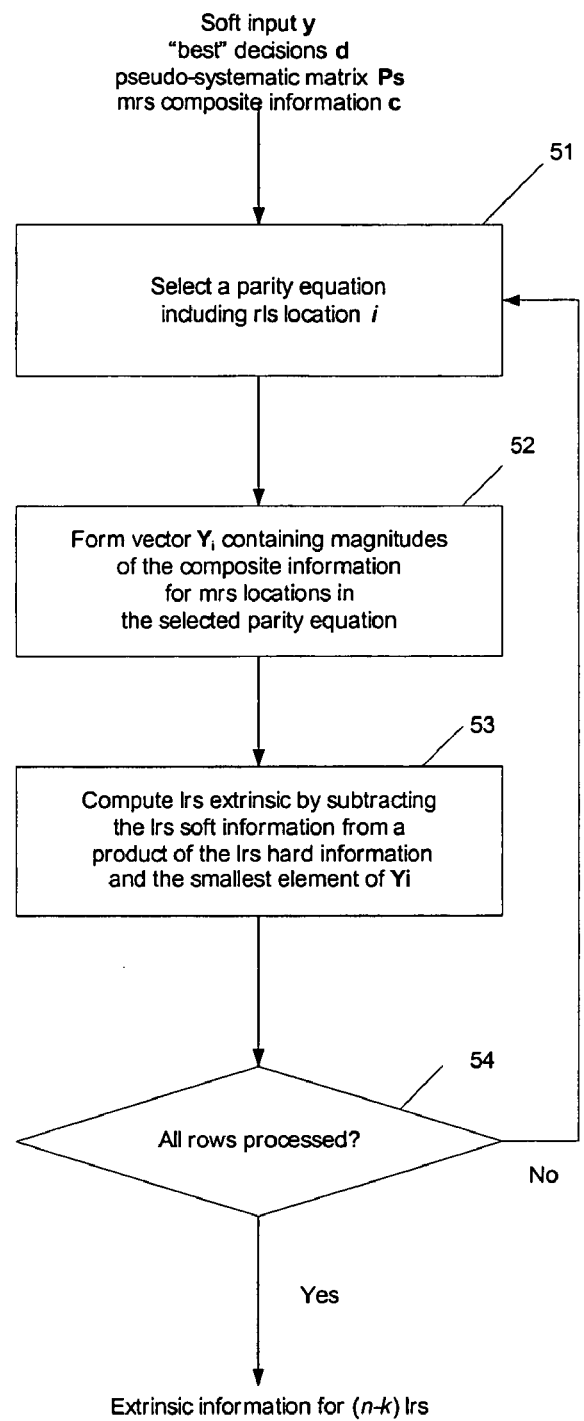
FIG. 5 is a flowchart of computing extrinsic information for least-reliable symbols.

With reference to FIG. 5, the steps of computing extrinsic information for the lrs locations can be summarized as follows:

In a first step 51 selecting from the set of parity equations associated with the parity check matrix Ps a parity equation that includes a least reliable symbol location i for which extrinsic information has not been computed yet.

In a next step 52 forming a vector $Y_i$ containing magnitudes of the composite information for mrs locations present in the selected parity equation.

In a next step 53 computing extrinsic information for the lrs location i by subtracting the soft information for the lrs location i from a product of the hard information for the lrs location i and a smallest element of the vector $Y_i$.

In a next step 54 verifying if all (n–k) parity equations or, equivalently, rows of the pseudo-systematic parity check matrix Ps, have been processed, and if not, repeating steps 51–54 until extrinsic information for all (n–k) lrs locations is computed.

In another embodiment, extrinsic information for the lrs locations can be computed following a modified algorithm comprising the steps of a) selecting from the set of parity equations associated with the parity check matrix Ps a parity equation that includes a lrs location i for which extrinsic information has not been computed yet, b) forming a vector $X_i$ of the extrinsic information for the mrs locations included in the selected parity equation, c) calculating a new vector $Y_i$ by subtracting from $X_i$ the contribution of the partial extrinsic information for mrs locations included in the selected parity equation, adding the input soft information for said mrs location, and then form the magnitude of the elements of $Y_i$, d) calculating the extrinsic information for the lrs location i by forming the product of the associated hard information for the lrs location i and the smallest element of $Y_i$, e) repeating steps (a)–(d) for all other parity equations containing the remaining least reliable symbol.

In some embodiments, the partial extrinsic information values for the lrs locations can be scaled as a function of the length n' of the corresponding parity equation containing the lrs location; such scaling can improve convergence of the iterative processing which is described hereafter.

In another embodiment, bounds on the values of the extrinsic information can be formed using length of the parity equations containing the corresponding symbol locations and an estimate of the probability of symbol error, and the extrinsic information value for a symbol location can be substituted with a pre-determined bound when said value exceeds the bound.

In another embodiment, the input information includes the soft input information vector, but may not include a hard decision vector. In this case, the described above general processing scheme shown in FIG. 1 undergoes small changes in steps 1 and 3 in the first iteration of the processing, in particular in steps 1 of computing the reliability vector, and step 3 of computing the approximate extrinsic information for the most reliable symbols.

With reference to FIG. 1, in the first step 1 the reliability vector is formed by the absolute values of the soft input information:

$$r_i = |y_i| \quad (14)$$

Figure 3:
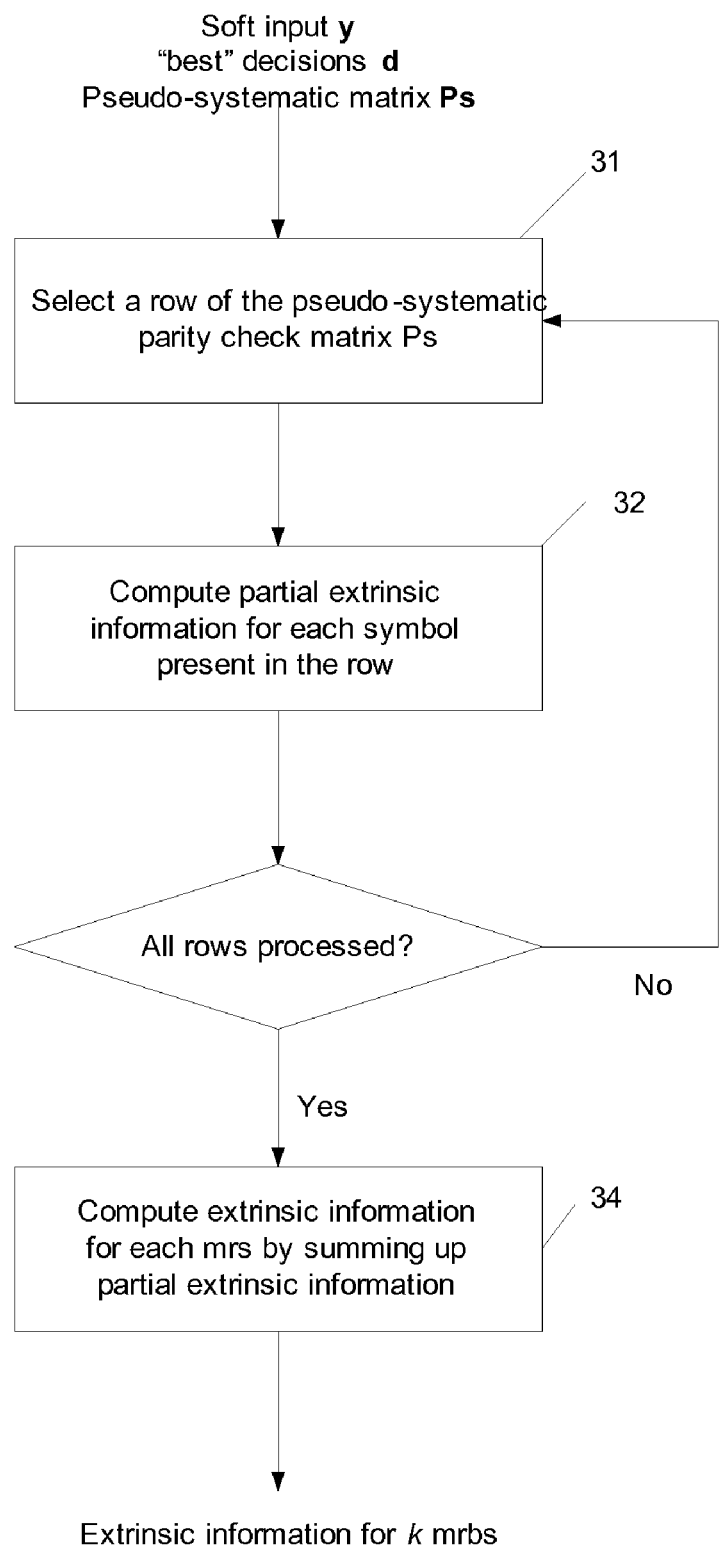
FIG. 3 is a flowchart of computing extrinsic information for most-reliable symbols.

With reference to FIG. 3, the step of calculating extrinsic information for the most reliable symbols is changed in the step 32, where the partial extrinsic information set $X_{m,p}$ for the most reliable symbol locations p present in the parity equation is computed by multiplying the reliability value of the least reliable symbol present in the parity equation by the product of the signs of the elements of the soft input vector $y_p$ for the most reliable symbols in the equation, excluding the current symbol for which the partial extrinsic information is calculated.

Figure 6:
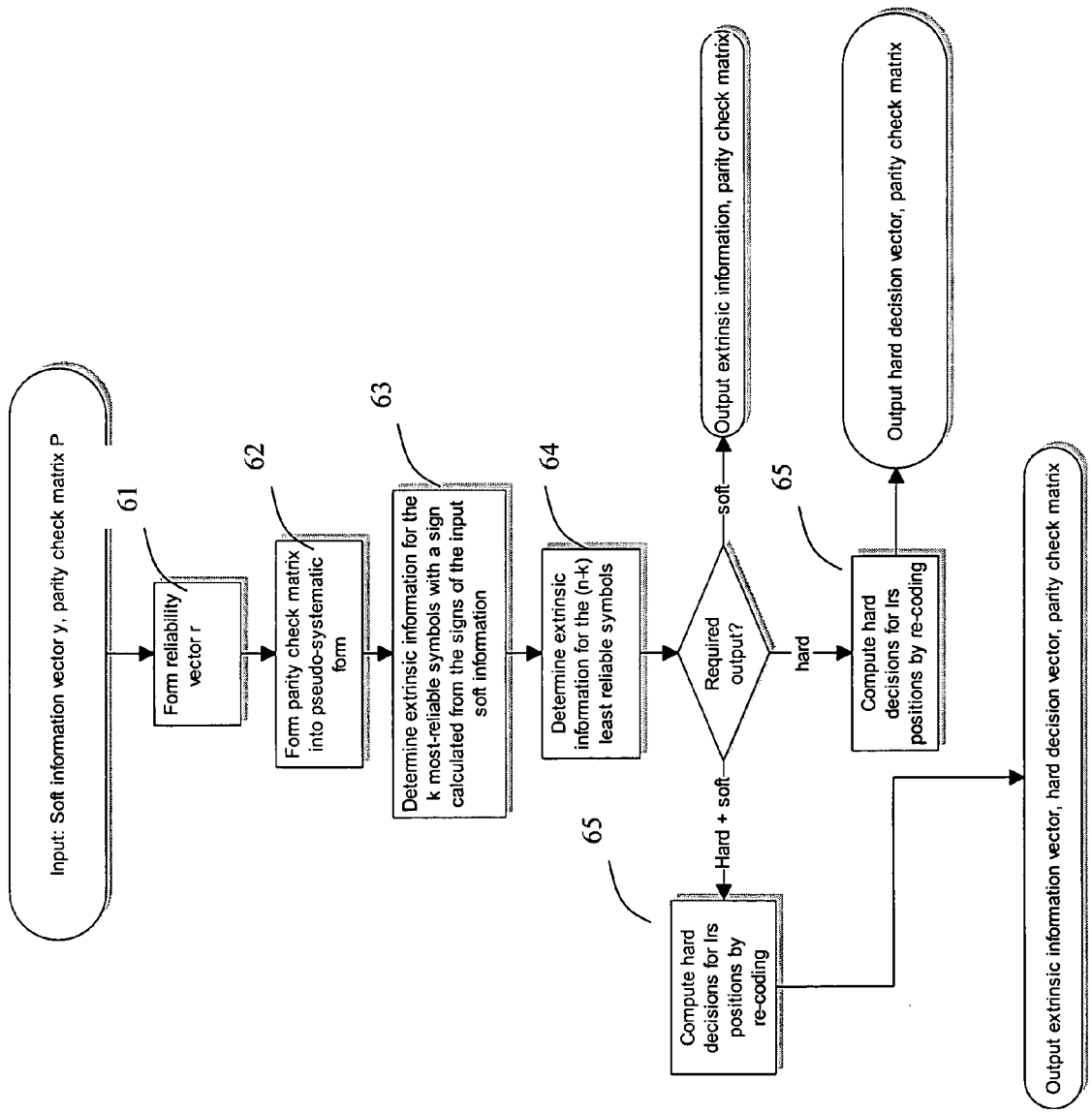
FIG. 6 is a flowchart of a simplified non-iterative decoding process.

With reference to FIG. 6, a simplified non-iterative embodiment of the method having only soft input information includes a first step 61 where the reliability vector is formed from absolute values of the input soft information, a second step 62 where a pseudo-systematic set of (n–k) parity equations, a set of (n–k) linearly-independent least reliable symbols and a set of k most reliable symbols are identified in the same way is in step 2 of FIG. 1 of the preferred embodiment, a third step 63 of computing the extrinsic information for the most reliable symbol locations contains a step of computing the partial extrinsic information set $X_{m,p}$ for each parity equation by multiplying the reliability value of the least reliable symbol present in the parity equation by the product of the signs of the elements of the soft input vector $y_p$ for the most reliable symbols in the equation, excluding the current symbol for which the partial extrinsic information is calculated, and steps 64 and 65 where extrinsic information values for the least reliable symbols and the hard decision values for the least reliable symbols are respectively calculated using the same processing as in the steps 8 and 9 of the main embodiment shown in FIG. 1.

The decoding method according to this embodiment may have an output including both the soft information vector and the hard information vector, which can further be used as the input for the iterative decoding method in accordance with the preferred embodiment of the present invention, as shown in FIG. 1 and FIG. 4.

In the embodiment of the invention described above, the parity check matrix P available to the method prior to the processing is converted to a pseudo-systematic parity check matrix Ps using a row reduction technique. In another embodiments, the (n–k) least reliable symbols and the pseudo-systematic parity check matrix Ps can be determined using other techniques, for example by using a list, matrices or other data structures that identify a set of (n–k) linearly independent parity equations each of which includes only one least reliable symbol.

We now present an illustrative example using a (16,11) extended Hamming code. The initial parity check matrix P can be represented as $$P = [1\,1\,1\,1\,0\,0\,1\,1\,0\,1\,0\,1\,0\,0\,0\,0 \quad (15)$$
$$1\,1\,1\,0\,1\,0\,0\,1\,1\,0\,1\,0\,1\,0\,0\,0$$
$$1\,1\,0\,1\,1\,1\,0\,0\,1\,1\,0\,0\,0\,1\,0\,0$$
$$1\,0\,1\,1\,1\,1\,1\,0\,0\,0\,1\,0\,0\,0\,1\,0$$
$$1\,0\,0\,0\,0\,1\,1\,1\,1\,1\,1\,0\,0\,0\,0\,1].$$

A full bi-orthogonal set is generated from basis vectors of the parity check matrix P. This is achieved by generating all possible code words of the dual code and their complement to form the bio-orthogonal set; relevant techniques are explained for example in a book by G. C. Clark, Jr. and J. Bibb Cain, entitled "Error Correction Coding for Digital Communications," Plenum Press, New York, 1981. All-zero and all-one code words are removed from the set as they do not correspond to any useful parity equations.

The bi-orthogonal set is stored in a matrix HSF. A partial matrix is shown in (16), the full matrix is not included for brevity.

$$HSF = [1011111000100010 \quad \%\text{Row 1} \quad (16)$$
$$1101110011000100 \quad \%\text{Row 2}$$
$$0110001011100110 \quad \%\text{Row 3}$$
$$\vdots$$
$$0101101100100101 \quad \%\text{Row 28}$$
$$0011100111000011 \quad \%\text{Row 29}$$
$$1000011111100001] \quad \%\text{Row 30}$$

An index matrix HSFIND is generated specifying which bit locations have a nonzero coefficient in matrix HSF, thus specifying which bits are involved in each of the of the complimentary parity equations. Equation (17) shows a part of the index matrix HSFIND.

$$HSFIND = [1 \quad 3 \quad 4 \quad 5 \quad 6 \quad 7 \quad 11 \quad 15 \qquad \%Row\ 1$$
$$1 \quad 2 \quad 3 \quad 5 \quad 6 \quad 9 \quad 10 \quad 14 \qquad \%Row\ 2$$
$$2 \quad 3 \quad 7 \quad 9 \quad 10 \quad 11 \quad 14 \quad 15 \qquad \%Row\ 3$$
$$\vdots$$
$$2 \quad 4 \quad 5 \quad 7 \quad 8 \quad 11 \quad 14 \quad 16 \qquad \%Row\ 28$$
$$3 \quad 4 \quad 5 \quad 8 \quad 9 \quad 10 \quad 15 \quad 16 \qquad \%Row\ 29$$
$$1 \quad 6 \quad 7 \quad 8 \quad 9 \quad 10 \quad 11 \quad 16] \qquad \%Row\ 30 \qquad (17)$$

To illustrate, Row 1 of HSFIND indicates that a one occurs in positions 1, 3, 4, 5, 6, 7, 11 and 15 of the HSF matrix. Row 1 therefore corresponds to a parity equation $$v_1 + v_3 + v_4 + v_5 + v_6 + v_7 + v_{11} + v_{15} = 0 \qquad (18)$$

where $v = \{v_1, v_2, v_3, \ldots, v_{16}\}$ represents a code word.

Another matrix COMPEQN can be formed with a list of the equations that a given bit is involved in. In this example a row index is a bit location and elements in the row represent index of the parity equation (i.e. Rows of the HSFIND matrix). For example, the first row indicates that the first bit is involved in parity equations (which are specified as rows of the HSFIND matrix) 1, 2, 4, ... 27, 30. Equation (19) shows a part of the matrix COMPEQN.

$$COMPEQN = [1 \quad 2 \quad 4 \quad 7 \quad 8 \quad 11 \quad 13 \quad 14 \quad 18 \quad 20 \quad 21 \quad 24 \quad 25 \quad 27 \quad 30 \qquad \%Row\ 1$$
$$2 \quad 3 \quad 4 \quad 5 \quad 8 \quad 9 \quad 14 \quad 15 \quad 16 \quad 21 \quad 22 \quad 25 \quad 26 \quad 27 \quad 28 \qquad \%Row\ 2$$
$$1 \quad 3 \quad 4 \quad 6 \quad 8 \quad 10 \quad 13 \quad 15 \quad 17 \quad 20 \quad 22 \quad 24 \quad 26 \quad 27 \quad 29 \qquad \%Row\ 3$$
$$\vdots$$
$$16 \quad 17 \quad 18 \quad 19 \quad 20 \quad 21 \quad 22 \quad 23 \quad 24 \quad 25 \quad 26 \quad 27 \quad 28 \quad 29 \quad 30 \qquad \%Row\ 16] \qquad (19)$$

To identify the (n−k) linearly independent least reliable bits in the received code word, we select a parity equation, and determine a position of a "least-reliable" bit among bit positions involved in the parity equation. Then a next equation is selected that does not contain any bit positions that were found to be "least reliable" in a previous equation. For example if the first bit was the least-reliable one in the first equation, the following equations to process should not contain the first bit. We can use the COMPEQN array to identify which equations need to be processed.

A software program can use an index or flag array to indicate which parity equations can be processed. For example, it can use a '0' in the index array to indicate it is a valid candidate and a '1' to indicate that we cannot choose that equation. For example consider the index array called INDEX that starts with all elements equal to 0, which indicates that all parity equations are valid. After processing parity equation 1, we could have found that the first bit location was the least reliable. To update the INDEX array, we set all positions that the first bit was involved in to be '1' to indicate that we can no longer process those equations.

Prior to processing equation 1: INDEX=[00000 00000 00000 00000 00000 00000] we find that the first bit location had the minimum reliability so we update the index array to INDEX=[10010 11001 10100 01101 00110 01011]. Note that the index array is shown from lrb to mrb going from right to left; for example, INDEX(1) is on the far right. To find a next linearly independent lrs position, any parity equation which has a '0' in the INDEX array can be selected. A simple method is to select an equation corresponding to first 0 location in the INDEX array. In this case, the third location is the first '0' so we could use the third equation.

The above process is repeated until the (n−k) lrs locations are found. In the case of the (16,11) code there are 5 of them.

To clarify, the steps to finding the (n−k) linearly independent lrs locations are a. set INDEX array to zero,
b. choose a parity equation corresponding to a zero in the INDEX array,
c. determine location of the bit with a minimum reliability magnitude,
d. eliminate from a set of valid parity equations all parity equations that contain said bit location,
e. return to step (2) until all n−k lrs locations are identified.

Next, a pseudo-systematic set of n−k parity equations linearly-independent with respect to the n−k lrs locations have to be identified. There are a number of implementations for this, however we will present the one that was used in our simulations.

First, a new matrix is formed from columns of the matrix HSF that correspond to the n−k linearly-independent lrs locations. Next, all rows of the new matrix having only one nonzero element are determined. These rows correspond to parity equations that contain only one of the bit locations with the minimum reliability magnitudes. Thus a new parity check matrix Ps with the n−k locations in the systematic part of the matrix can be formed.

In another embodiment, the method of the present invention can be used to decode non-binary codes, such as Reed-Solomon (RS) codes which have symbols defined over $GF(q^m)$. The present method is not limited to binary codes as it applies to any symbol and arithmetic required for linear block codes and thus will work with minimal modifications for non-binary codes as hereafter described. A potential simplification is to convert a (n,k) non-binary code over $GF(q^m)$ to a (mn,mk) code over $GF(q)$ by well known methods. The algorithm calculations thus simplify as it may be easier to implement arithmetic in $GF(q)$ than $GF(q^m)$ in some devices.

To demonstrate the method we consider a Reed-Solomon (7,5) code over GF(8) that can be converted to a binary code (21,15) which uses GF(2) arithmetic. The field of GF(8) was generated with $p(x)=x^3+x+1$. The generator polynomial for the (7,5) code was given by $$g(x) = (x - \alpha^0)(x - \alpha^1).$$
$$= x^2 + \alpha^3 x + \alpha$$

The associated generator matrix is $G=[I_5|H^T]^T$ where $I_k$ is a k×k identity matrix, T is the transpose operator and a parity matrix H is generated using g(x) and is defined by $$H = \begin{bmatrix} \alpha^6 & \alpha^1 & \alpha^2 & \alpha^5 & \alpha^3 \\ \alpha^2 & \alpha^3 & \alpha^6 & \alpha^4 & \alpha^1 \end{bmatrix}.$$

The elements of GF(8) can be mapped onto the basis functions for GF(2) to form a (21,15) binary generator matrix. To generate the binary matrix we replace the generator matrix elements in GF(8) with the appropriate 3×3 binary matrix that represents the element. By using methods known to those skilled in the art we obtain a new generator matrix of the form $G=[I_{15}|H^T]^T,$ where H is defined by $$H = [\ 001010101011110$$
$$100101110001111$$
$$011100010111101$$
$$101110001111010$$
$$110111100011101$$
$$010101011110100\ ].$$

Figure 7:
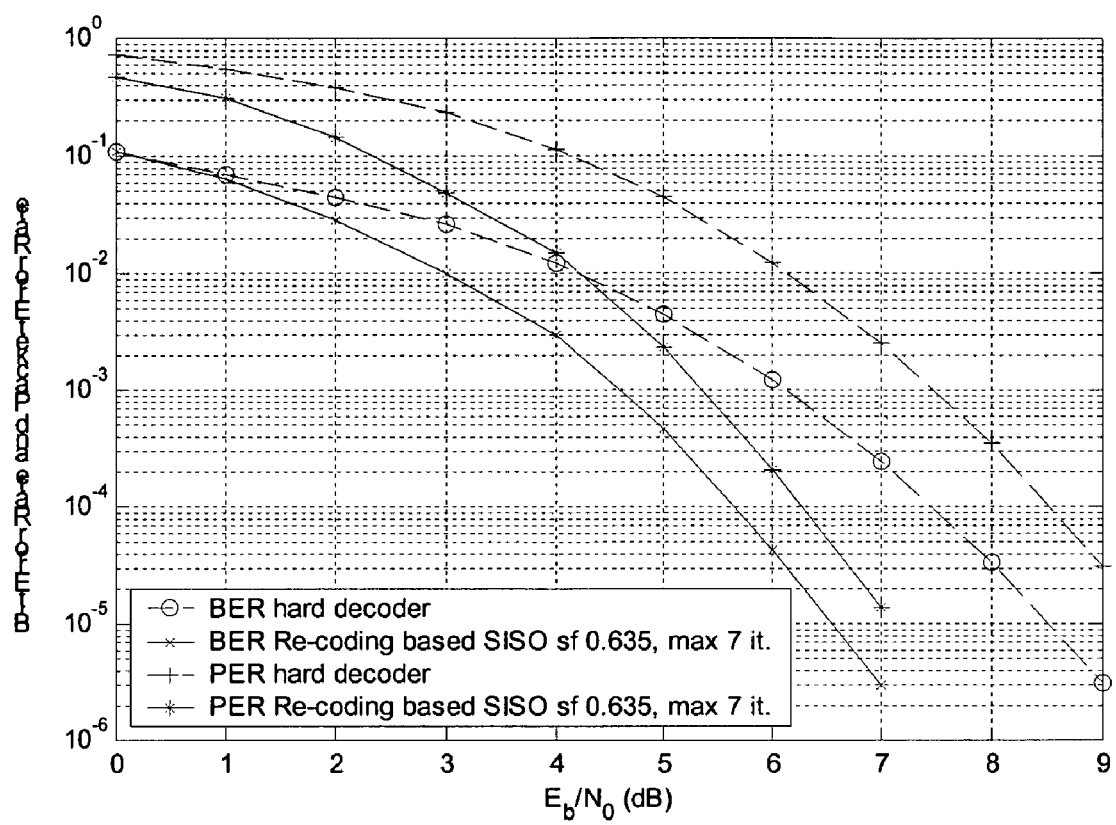
FIG. 7 is simulation results of the (21,15) binary code version of the Reed-Solomon RS(7,5) code over GF(8) compared to an idealized hard input decoder that corrects one symbol error.

With reference to FIG. 7, this binary matrix H and the corresponding parity check matrix $P=[H|I_6]$ was used to simulate the RS(7,5) code transmitted over an additive white Gaussian noise (AWGN) channel using a binary phase shift keying (BPSK), and to compare the iterative re-coding based soft-in-soft-out decoding method of the preferred embodiment of the present invention to an ideal hard-input decoder.

The extrinsic information was scaled with a scaling factor of 0.635. The maximum number of iterations was set to 32 although all trials converged within 7 iterations. The simulation results are shown in FIG. 7. The hard decision decoder performance was estimated by making hard decisions on the binary data and grouping the decisions into groups of 3 binary digits. A group represented symbols of GF(8) and if there were less than two symbol errors, the code word was declared error-free. If there was more than 1 symbol error, the errors in the systematic bits were recorded. FIG. 7 shows a 2 dB gain in performance for recoding based SISO compared with the hard decision RS decoder that corrects 1 symbol error.

In another embodiment, the method of present invention is used to decode a non-binary linear block code without the intermediate step of converting the non-binary code to an equivalent binary code. This embodiment, wherein the method is directly applied to non-binary linear block codes (n, k) comprised of m-ary symbols defined over a Galois filed GF(r), will now be described.

In the decoding process the m-ary symbols are assumed to be represented as m integers i=0, ..., m–1. Note that a case of m=2 corresponds to a binary input word, and the hereafter described embodiment of the method is therefore applicable to a binary as well as non-binary linear block codes.

Figure 8:
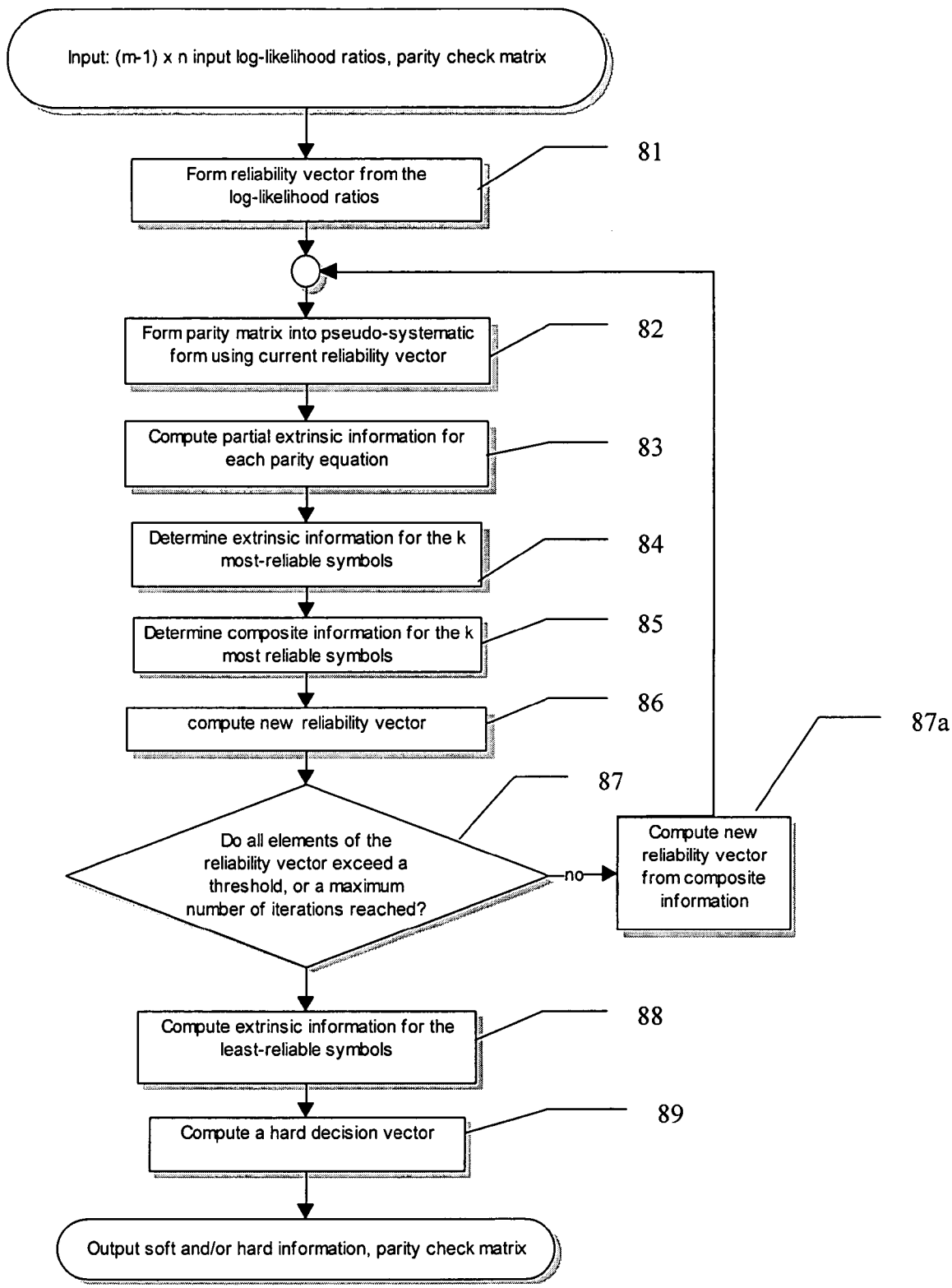
FIG. 8 is a flowchart of a decoding process for an m-ary code word of a linear block code (n, k).

With reference to FIG. 8, input information includes a set of at least (m–1) log likelihood ratios for each symbol position in a received sequence of samples $y_j$ forming a soft information vector y of length n. The soft information vector y corresponds to a corrupted by noise code word c which is to be decoded. The log-likelihood ratios can be computed from elements of the soft information vector y from an equation (20)

$$L_{ij} = \log \frac{P(x_{ij}|y)}{P(x_{0j}|y)} \qquad (20)$$

wherein $P(x_{ij})$ is a probability of having a symbol i in j-th symbol position in the original code word given the received soft information vector y. The log-likelihood ratios are thereby defined herein with respect to a zero symbol, so that $L_{0i}=0$; other definitions are possible.

The log-likelihood ratios for the received samples of the code word can be arranged in a m×n matrix of log-likelihood ratios L which elements $L_{ji}$ are defined by equation 20. Each columns $L_j$ represent an m-vector of log-likelihood ratios for a symbol positions. Note that the first row of matrix L contains all zero elements and therefore does not carry any information; it can be therefore be omitted in some embodiments to improve computational efficiency. Similarly, the first element of vector $L_j$ is always a zero symbol and could be omitted as well.

In a first step 81, elements $r_j$ of the reliability vector r are calculated from the log-likelihood ratios as a difference between a maximum log-likelihood ratio and a second largest log-likelihood ratio for each symbol position j.

In another embodiment, the first step 81 can include first computing of the log-likelihood ratios using equation 20 if the input information includes only the soft input information vector y.

In a second step 82, (n–k) least reliable symbol positions are identified and the pseudo-systematic parity-check matrix Ps is formed using the aforedescribed processing steps, for example those shown in FIG. 2. Rows of the matrix Ps define a system of (n–k) parity equations wherein each equation includes a one and only one least-reliable symbol position.

In a third step 83, partial extrinsic information for the most-reliable symbol positions is computed from each parity equation. This can be done using a number of code processing techniques known to those skilled in the art, such as a soft-output Viterbi algorithm, a max-log-APP algorithm, log-APP algorithm or a true APP algorithm.

An embodiment is hereafter described wherein the partial extrinsic information for symbol positions present in a parity equation is computed by carrying out the max-log-APP processing on a trellis associated with said single parity check equation. This processing is a straightforward implementation of a prior-art algorithm, a brief description of which will now be given. Details of an APP algorithm for non-binary codes can be found for example in a paper by P. Robertson and Thomas Wörz, "Bandwidth-Efficient Turbo Trellis-Coded Modulation Using Punctured Component Codes," IEEE Journal on Selected Areas of Communication Vol. 16, No. 2, February 1998.

A single parity check equation $$\sum_{j=1}^{n} a_j * v_j = 0$$

is described with a trellis having a maximum of M states where M is the number of values that $v_j$ can take and a number of symbol positions equivalent to the number of non-zero coefficients, (i.e. $a_j \neq 0$) in the parity check equation. Each symbol position corresponds to a time interval in the received sequence of soft symbols where $a_j \neq 0$. The states at a given time interval are the possible partial sums of the terms in the parity equation up to a corresponding symbol position. By definition a trellis for a parity check equation will start and end in a zero state. A state $s_{j-1}$ at a time interval (j−1) is joined by a branch to a state $s_j$ at a time interval j due to an addition of an input symbol $v_{j-1}$, so that $s_j = s_{j-1} \oplus (a_{j-1} * v_{j-1})$ where '$\oplus$' and '*' are defined as addition and multiplication operations in the arithmetic used for the parity equation and $a_{j-1}$ is a coefficient for the $(j-1)^{st}$ element in the parity equation. A branch metric of a branch joining the states $s_{j-1}$ and $s_j$ is defined as the log-likelihood ratio for the symbol that is required for the transition, denoted as $g(s_{j-1}, s_j)$. For a forward pass through the trellis a state metric at the time interval j is computed by finding a maximum of cumulative metrics for the branches entering the state from all states at the time interval (j−1). A backward pass is done similar to a forward pass, but the algorithm works from the highest to lowest time interval. The cumulative metric of a branch is defined as a sum of the branch metric for the branch entering the state and the state metric of the state that the branch exited. The algorithm makes a forward and a backward pass through the trellis calculating forward and backward state metrics. The forward and backward metrics for the state $s_j$ will be denoted as $f(s_j)$ and $b(s_j)$, respectively. A combined metric for a branch $g(s_{j-1}, s_j)$ is defined as a sum of the forward metric for the state $s_{j-1}$, the branch metric for the symbol $v_{j-1}$ joining states $s_{j-1}$ and $s_j$ and the backward metric from state $s_j$. Combined metrics for the symbol $v_{j-1}$ are calculated for all branches involving the symbol, and a new updated log-likelihood ratio for the symbol $v_{j-1}$ is formed by taking a maximum of the combined metrics for all branches involving the symbol $v_{j-1}$. This is repeated for all symbols and all time intervals to get the log-likelihood ratios for the symbols involved in the parity equation. As the log-likelihood ratios are relative to the zero symbol in this implementation, we form a normalized log-likelihood ratio by subtracting the log-likelihood ratio that was calculated for the zero symbol from each symbol at a given time interval.

The max-log APP processing of the trellis associated with a parity equation l produces updated log-likelihood ratios $L_{ij}^l$ for all symbol positions j present in a parity equation and the partial extrinsic information $X_{ij}^l$ can be calculated by taking a difference between the updated and the input log-likelihood ratios:

$$X_{ij}^l = L_{ij}^l - L_{ij} \tag{21}$$

The partial extrinsic information for a symbol location j computed from a parity equation l can be stored in a partial extrinsic vector $X_j^l$ having at least (m−1) elements corresponding to the (m−1) non-zero log-likelihood ratios for each symbol position. It is hereafter assumed that the partial extrinsic information vectors are augmented with a zero first element and therefore contain m elements.

In a next step 84, extrinsic information $E_{ij}$ for each symbol i at each most reliable symbol position j is determined by adding together partial extrinsic information calculated in step 83, forming an extrinsic information matrix E having elements $E_{ij}$. This can be done for example by summing up vectors $X_j^l$ for each symbol positions and thereby producing a vector of extrinsic information $E_j$ for each most reliable symbol j.

Alternatively, the partial extrinsic information computed in step 83 for each symbol i from a parity equation l can be stored in an element $Ext\_i_{il}$ of a partial extrinsic matrix $Ext\_i$ for that symbol, producing thereby m matrixes $Ext\_i$ each having n columns and (n−k) rows. A set of (m−1) row vectors $E_i'$ of extrinsic information for each symbol i except the zero symbol is computed by summing rows of each of the (m−1) matrixes $Ext\_i$, and the extrinsic matrix can be formed as $$E = [0 E_1 E_2 \ldots E_{m-1}]^T \tag{22}$$

where T is matrix transpose operator.

In a next step 85, the composite information $C_{ij}$ for each symbol i at each symbol position j is determined by adding the input log-likelihood ratios to the corresponding extrinsic information. In matrix representation, this step corresponds to forming a matrix $$C = L + E. \tag{23}$$

In a next step 86, elements $r_j'$ of a new reliability vector r' are computed for each symbol position j as a difference between a maximum composite information and a second largest composite information for each symbol position j.

In a next step 87, elements of the new reliability vector corresponding to the mrs positions are compared to a small pre-determined threshold z. If any of these elements is less than z, the processing is returned to step 82 wherein a new set of lrs positions is identified, and a new pseudo-systematic matrix Ps is formed. The process iterates through steps 82–87 until all reliability values for mrs positions exceed z, or until a pre-determined maximum number of iterations is reached.

In a next step 88, extrinsic information for the least reliable symbol positions is updated. In a preferred embodiment, this step further comprises the steps of a) selecting a parity equation l that includes a least reliable symbol position $i_l$ from the set of parity equations associated with the parity check matrix Ps, b) forming new information vectors $Y_j^l$ for each most reliable symbol position j present in the parity equation l by subtracting partial extrinsic information vectors $X_j^l$ computed for said parity equation l from composite information vectors $E_j$, wherein the composite information vectors $E_j$ represent columns of the composite information matrix L" corresponding to j-th symbol position, c) computing a set of new log-likelihood ratios for the least-reliable symbol position present in the parity equation l from said parity equation using the new information vectors $Y_j$, d) computing a new extrinsic information vector for the least reliable symbol position $i_l$ by subtracting the log likelihood ratios included in the input information for the symbol location $i_l$ from the new log likelihood ratios for said least reliable symbol position, e) repeating steps (a)–(d) for all other parity equations containing the remaining least reliable symbol.

In the preferred embodiment, step (c) of computing a set of new log-likelihood ratios for the lrs position present in the parity equation 1 is accomplished by the max-log-APP processing on trellis for the parity equation 1 using the new information vector $Y_j$ associated with said parity equation to define the branch metrics.

In a final step 89, a hard decision vector d is computed if a hard output is required. In a preferred embodiment, an element $d_j$ of the hard decision vector, which is a symbol decision for a symbol position j, is estimated as a row index of a maximum element of the composite information $L_{ji}$ from the $j^{th}$ column of the matrix L.

$$d_j = \arg\max_{i \in \{0,1,\ldots,m-1\}} \{L_{ji}\} \quad (24)$$

Step 89 may be omitted if only soft information is required as an output. Similarly, if only hard information is required as an output of the method, the step 88, wherein log-likelihood ratios for the least-reliable symbol positions are computed, may be omitted.

Note that in this embodiment of the method which employs the max-log-APP processing algorithm to compute the partial extrinsic information, hard decisions on the composite information computed in the step 85 in accordance with equation (24) produce a code word, so a separate re-coding step similar to the steps 3 and 8 of the embodiment shown in FIG. 1 is not required.

The invention claimed is:

1. In a receiver comprising a decoder, a method of decoding a transmitted word of a linear block code (n, k) of length n and dimension k in a signal received via a communication channel, the method comprising the steps of:
   providing input information related to the transmitted word to the decoder, said input information comprising a sequence of samples of the signal or at least in part obtained from said sequence;
   using one or more computation devices for estimating original transmitted data by performing the following steps:
   forming a reliability vector from the input information;
   identifying (n−k) linearly independent least reliable symbols and k most reliable symbols, and converting a parity check matrix P of the linear block code to a pseudo-systematic parity check matrix Ps with respect to the least reliable symbols so that each of (n−k) parity equations associated with the (n−k) rows of the pseudo-systematic parity check matrix Ps includes only one least reliable symbol;
   determining extrinsic information for each most reliable symbol from the input information and the pseudo-systematic parity check matrix Ps, and storing said extrinsic information;
   e) generating output information providing an estimate of the original transmitted data by
      calculating extrinsic information for the least reliable symbols using parity equations associated with the rows of the pseudo-systematic parity check matrix Ps, the input information, and the stored extrinsic information for the most reliable symbols, and/or
      assigning hard information values for the least reliable symbols using parity equations associated with the rows of the pseudo-systematic parity check matrix Ps, and hard information values for the most reliable symbols.

2. A method as defined in claim 1 wherein the input information is related to a word of a non-binary linear block code over $GF(2^m)$, which is mapped to a binary linear block code prior to decoding.

3. A method as defined in claim 1 wherein the least reliable symbols and the pseudo-systematic parity check matrix Ps are determined using a row reduction technique.

4. A method as defined in claim 3 wherein the row reduction technique includes the steps of:
   a) selecting a row from a parity check matrix P,
   b) determining a least reliable symbol location as the symbol location with a minimum value in the reliability vector from the symbol locations present in a parity equation associated with the selected row from the parity check matrix P,
   c) modifying the parity check matrix P using an algebraic manipulation such that no other row in the matrix has a non-zero coefficient at the identified least reliable symbol location,
   d) repeating steps (a)–(c) for other rows of the modified parity check matrix until all (n−k) rows are processed, and (n−k) linearly-independent least reliable symbols are determined.

5. A method as defined in claim 1 wherein the (n−k) least reliable symbols and the pseudo-systematic parity check matrix Ps are determined by using a list, matrices or other data structures that identify a set of (n−k) linearly independent parity equations each of which includes only one least reliable symbol.

6. A method as defined in claim 1 wherein the input information is soft information related to a binary word of a linear block code (n, k), and wherein the reliability vector is generated from magnitudes of the soft information.

7. A method as defined in claim 6, wherein the step of determining extrinsic information for the most reliable symbols is comprised of the steps of:
   determining from each parity equation associated with the pseudo-systematic matrix Ps a set of partial extrinsic information $X_j$ for each most reliable symbol location j present in the parity equation, by multiplying the reliability value of the least reliable symbol present in the parity equation by a product of the signs of input soft values for the symbols in the equation, excluding the current symbol for which the partial extrinsic information is calculated; and,
   generating a most reliable symbol extrinsic information vector by summing partial extrinsic information values $X_j$ for each most reliable symbol location j from each parity equation which includes the j-th most reliable symbol location.

8. A method as defined in claim 7, wherein the step of generating extrinsic information for the least reliable symbols comprises the steps of:
   a) selecting a parity equation that includes a least reliable symbol aj from the parity check matrix Ps,
   b) forming a vector Xaj of the extrinsic information for the most reliable symbol locations included in the selected parity equation,
   c) calculating a new vector Yaj by subtracting from Xaj the contribution of the partial extrinsic values for the selected parity equation, and adding the input soft information for each most reliable symbol location for the said parity equation,
   d) identifying the smallest element of the said vector Yaj,
   e) assigning the magnitude of the smallest element of the said vector Yaj to the magnitude of the extrinsic information for the least reliable symbol $a_j$, f) calculating the sign of the extrinsic information for the least reliable symbol aj as the product of the signs of the input soft information for the bits involved in the said parity equation, excluding the bit location that corresponds to the element of Yaj with the minimum magnitude, g) repeating steps (a)–(f) for all other parity equations containing the remaining lrs.

9. A method as defined in claim 1 wherein the input information includes hard information and soft information related to the linear block encoded data, and wherein elements of the reliability vector are determined as a product of the input soft information and the hard information for each symbol location, wherein the hard information is in bipolar format, where logical "1" and '0' are mapped to −1 and 1 respectively.

10. A method as defined in claim 9, wherein the step of determining extrinsic information for the most reliable symbols is comprised of the steps of:

determining from each parity equation associated with the pseudo-systematic matrix Ps a set of partial extrinsic information $X_j$ for each most reliable symbol locations present in the parity equation, by multiplying the reliability value of the least reliable symbol present in the parity equation by a product of the signs of hard information for the most reliable symbol locations present in said equation, excluding the current symbol for which the partial extrinsic information is calculated; and, generating a most reliable symbol extrinsic information vector by summing partial extrinsic information values $X_j$ for each most reliable symbol location j from each parity equation which includes the j-th most reliable symbol location.

11. A method as defined in claim 10, further comprising the steps of calculating composite information for the most reliable symbol locations by adding the soft input information to the extrinsic information for said symbol locations, identifying most reliable symbol locations for which the hard information have signs opposite to the signs of the composite information, changing the sign of the hard information for a one or more of the most reliable symbol locations for which the hard information have signs opposite to the signs of the composite information, calculating new hard information values for the least reliable symbols from the hard information for the most reliable symbols and the parity equations associated with the parity matrix Ps.

12. A method as defined in claim 11, wherein the step of changing the sign of the hard information for a one or more of the most reliable symbol locations comprises a step of first selecting the one or more symbol locations that have largest composite information magnitude from the most reliable symbol locations for which the hard information have signs opposite to the signs of the composite information.

13. A method as defined in claim 11, wherein the new hard information is used as a hard output information.

14. A method as defined in claim 11, wherein the new hard information is used to calculate extrinsic information for the least reliable symbols.

15. A method as defined in claim 14, wherein the extrinsic information for the least reliable symbols and the most reliable symbols is used as soft output information.

16. A method as defined in claim 14, wherein the step of calculating extrinsic information for the least reliable symbols comprises the steps of selecting a parity equation that includes a least reliable symbol $a_j$ from the parity check matrix Ps, identifying a smallest value Cmin from magnitudes of composite information for the most reliable symbol locations included in the selected parity equation, calculating extrinsic information for the least reliable symbol aj by subtracting the original soft information for the least reliable symbol aj from the product of Cmin and the hard information for the least reliable symbol aj, repeating steps (a)–(c) for all other parity equations containing the remaining least reliable symbol.

17. A method as defined in claim 11, wherein the new hard information and the original soft information is further used as input for an iterative decoding process.

18. A method as defined in claim 17, wherein the iterations stop when the hard information has the same sign as the composite information for each of the l most reliable bit locations, or when a maximum number of iterations is reached.

19. A method as defined in claim 1, wherein a final parity check matrix Ps is included in the output information.

20. A method as defined in claim 1, wherein a parity check matrix for the linear block code is included with the input information.

21. A method as defined in claim 1, wherein the partial extrinsic information for the most reliable symbol locations is scaled as a function of the length of the parity equations in which it is involved and the extrinsic information for each least reliable symbol locations is scaled as a function of the length of the parity equation that contains it.

22. A method as defined in claim 1, wherein an extrinsic value for a symbol location is substituted with a predetermined bound when the said value exceeds the said bound.

23. A method as defined in claim 1 wherein the input information is soft information related to a non-binary word of a linear block code, wherein the non-binary code word is comprised of m-ary symbols, and wherein the m-ary symbols are elements of a Galois field GF(m).

24. A method as defined in claim 23 wherein the input information includes an input vector of (m−1) log likelihood ratios for each symbol position of said non-binary word, and wherein elements of the reliability vector are generated from the log likelihood ratios for each symbol position of the non-binary word.

25. A method as defined in claim 24 wherein elements of the reliability vector are generated by subtracting a second largest input log-likelihood ratio from a maximum input log-likelihood ratio for each symbol position.

26. A method as defined in claim 24 wherein the step of determining extrinsic information for the most reliable symbols comprises the steps of:

determining from each parity equation associated with the pseudo-systematic matrix Ps a partial extrinsic information vector $X_j^l$ for each most reliable symbol position j present in the parity equation l; and, generating an extrinsic information vector $E_j$ for each most reliable symbol position j by summing up the partial extrinsic information vectors $X_j^l$ for said symbol position j determined from each parity equation l including the j-th symbol location.

27. A method as defined in claim 26 wherein the step of determining the set of vectors of partial extrinsic information from each parity equation further comprises the steps of:
- selecting a parity equation from the set of parity equations associated with the pseudo-systematic parity check matrix Ps,
- computing a set of new log-likelihood ratios for symbol locations present in the selected parity equation from said parity equation and the input log-likelihood ratios,
- computing the set of partial extrinsic information vectors $X_j$ by subtracting the input log likelihood ratios for the symbol locations j present in the parity equation from the new log likelihood ratios for same symbol locations.

28. A method as defined in claim 26 further comprising a step of calculating composite information vectors $C_j$ for each symbol position j by summing the extrinsic information $E_j$ and the input vector of log-likelihood ratios for the symbol position j.

29. A method as defined in claim 28 further comprising the steps of
- calculating a new reliability vector r' from the composite information vectors $C_j$,
- comparing each element $r'_j$ of the new reliability vector r' with a pre-determined threshold z,
- identifying a new set of (n–k) least reliable symbol positions from the new reliability vector r' and a new pseudo-systematic matrix Ps' if it is found that at least one element of the new reliability vector r' is smaller than the pre-determined threshold z.

30. A method as defined in claim 28 further comprising a step of computing hard output information from the composite information vectors $C_j$.

31. A method as defined in claim 27, wherein the step of generating extrinsic information for the least reliable symbols comprises the steps of:
- selecting a parity equation l that includes a least reliable symbol position ii from the parity check matrix Ps,
- forming new information vectors $Y_j$ for each most reliable symbol position j present in the parity equation l by subtracting partial extrinsic information vectors $X_j^l$ computed for said parity equation l from the extrinsic information vectors $E_j$ and adding log likelihood ratios for the symbol positions j included in the input information,
- computing a set of new log-likelihood ratios for the least-reliable symbol location present in the parity equation l from said parity equation using the new information vectors $Y_j$,
- computing a new extrinsic information vector for the least reliable symbol position $i_l$ by subtracting the log likelihood ratios included in the input information for the symbol location $i_l$ from the new log likelihood ratios for said least reliable symbol position.

* * * * *